(12) United States Patent
Mitsui et al.

(10) Patent No.: US 7,595,089 B2
(45) Date of Patent: Sep. 29, 2009

(54) DEPOSITION METHOD FOR SEMICONDUCTOR LASER BARS USING A CLAMPING JIG

(75) Inventors: Nobuyuki Mitsui, Osaka (JP); Hiroshi Inada, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 125 days.

(21) Appl. No.: 11/940,415

(22) Filed: Nov. 15, 2007

(65) Prior Publication Data

US 2008/0121183 A1    May 29, 2008

Related U.S. Application Data

(62) Division of application No. 10/843,976, filed on May 11, 2004, now abandoned.

(30) Foreign Application Priority Data

May 13, 2003  (JP)  ............... 2003-135090

(51) Int. Cl.
*C23C 16/00* (2006.01)
*C23C 16/06* (2006.01)

(52) U.S. Cl. .................................. 427/248.1

(58) Field of Classification Search ............... 427/248.1
See application file for complete search history.

(56) References Cited

U.S. PATENT DOCUMENTS

| | | | | |
|---|---|---|---|---|
| 3,638,930 A | * | 2/1972 | Hart, Jr. ................ | 432/253 |
| 3,877,134 A | * | 4/1975 | Shanahan .............. | 29/417 |
| 4,153,164 A | * | 5/1979 | Hofmeister et al. .... | 211/41.18 |
| 4,228,902 A | * | 10/1980 | Schulte ................. | 211/41.18 |
| 4,381,965 A | * | 5/1983 | Maher, Jr. et al. ..... | 156/345.45 |
| 4,470,856 A | * | 9/1984 | Little et al. ........... | 156/64 |
| 4,566,839 A | * | 1/1986 | Butler .................. | 414/404 |
| 4,661,033 A | * | 4/1987 | Worsham .............. | 414/405 |
| 4,679,689 A | * | 7/1987 | Blome .................. | 206/711 |
| 4,745,470 A | * | 5/1988 | Yabe et al. ............ | 348/76 |
| 4,779,732 A | * | 10/1988 | Boehm et al. ......... | 206/454 |
| 4,841,906 A | * | 6/1989 | deGeest, Jr. .......... | 118/500 |
| 4,873,942 A | * | 10/1989 | Engle ................... | 118/728 |
| 5,007,788 A | * | 4/1991 | Asano et al. .......... | 414/416.09 |
| 5,054,418 A | * | 10/1991 | Thompson et al. ..... | 118/500 |
| 5,090,432 A | * | 2/1992 | Bran ..................... | 134/139 |
| 5,154,873 A | * | 10/1992 | Sato et al. ............. | 264/279 |
| 5,183,378 A | * | 2/1993 | Asano et al. .......... | 414/757 |
| 5,639,203 A | * | 6/1997 | Lee ...................... | 414/416.02 |
| 6,216,874 B1 | * | 4/2001 | Bores et al. ........... | 206/711 |
| 6,295,307 B1 | * | 9/2001 | Hoden et al. .......... | 372/36 |

(Continued)

FOREIGN PATENT DOCUMENTS

JP    2002164609    6/2002

*Primary Examiner*—Rudy Zervigon
(74) *Attorney, Agent, or Firm*—Fish & Richardson P.C.

(57) ABSTRACT

A clamping jig for mounting semiconductor laser bars includes: multiple supporting bars for holding laser bars therebetween; a pair of supporting plates each of which has a mounting face for mounting the supporting bars in a row; a pressing member for pressing the supporting bars for holding the laser bar; pressing cover members for covering both ends of each supporting bar to prevent supporting bars from falling from the supporting plate; and a supporting frame for detachably supporting the supporting plates and pressing cover members. Each supporting bar is formed with a longitudinal length greater than the laser bar, within a predetermined length so as to be mounted within the supporting frame. Both of the pair of supporting plates may be mounted so as to face one another, or just one may be mounted with the pressing cover members being mounted on the supporting frame instead of the other supporting plate.

6 Claims, 7 Drawing Sheets

U.S. PATENT DOCUMENTS 6,321,680 B2 * 11/2001 Cook et al. .............. 118/723 E
6,537,010 B2 * 3/2003 Martin et al. ............... 414/156
6,776,289 B1 * 8/2004 Nyseth ...................... 206/711
2001/0022703 A1 * 9/2001 McCutcheon et al. .... 360/98.08
2005/0000451 A1 1/2005 Mitsui et al.

* cited by examiner

DEPOSITION METHOD FOR SEMICONDUCTOR LASER BARS USING A CLAMPING JIG

CROSS-REFERENCE TO RELATED APPLICATION(S)

This application is a divisional of U.S. application Ser. No. 10/843,976, filed on May 11, 2004.

BACKGROUND OF THE INVENTION

1. Field of the Invention

The present invention relates to a clamping jig for clamping semiconductor laser bars formed by cleaving a semiconductor wafer into a number of bars, and particularly to a clamping jig used for forming a reflection coating of predetermined reflectivity by vapor deposition or sputtering on a predetermined face of each semiconductor laser bar.

2. Description of the Related Art

In many cases, a semiconductor laser device has a configuration wherein reflection coating is formed with predetermined reflectivity on the optical beam output end face of a laser chip.

Formation of the aforementioned reflection coating is made as follows. First, a number of electrodes 101 are formed on a semiconductor wafer 100, following which cleavages 102 are formed between adjacent electrodes 101, as shown in FIG. 7A.

Subsequently, as shown in FIG. 7B, the semiconductor wafer 100 is cleaved into a number of bars so as to form multiple laser bars 100a (which are each formed in the shape of a bar having multiple electrodes linearly arrayed thereon).

Conventionally, each divided laser bar 100a is mounted on a clamping jig, following which the clamping jig mounting the laser bar 100a is mounted on a holder in a vapor deposition chamber. The holder for mounting the clamping jig is provided at the upper portion in the chamber and a vapor source is provided at the lower portion in the chamber.

Vapor deposition is performed as follows. First, the chamber is evacuated to a predetermined degree of vacuum. Subsequently, the vapor deposition material loaded into the vapor source is heated by an electron beam or the like so as to evaporate, thereby forming reflection coating on a side face of the laser bar 100a (such side face corresponds to an end face of a laser chip). Thus, by the aforementioned vapor deposition, the reflection coating made of a vapor deposited film is formed on a side face of the laser bar 100a.

However, with the above-described conventional vapor deposition method, the work for mounting laser bars has been troublesome since each laser bar 100a is mounted on a single clamping jig. In particular, in the case where vapor deposited films are to be formed on the faces of both sides of a laser bar, when a vapor deposition process for one side of the laser bar is finished, the laser bar must be removed and reset so as to expose the other side face of the laser bar, which is a troublesome work.

A means has been proposed as disclosed in Japanese Unexamined Patent Application Publication No. 2002-164609, wherein multiple laser bars are mounted on a single clamping jig so as to perform vapor deposition onto both end faces while keeping the laser bars mounted on the clamping jig.

With the vapor deposition process disclosed in Japanese Unexamined Patent Application Publication No. 2002-164609, the multiple laser bars 100a are mounted on a clamping jig A shown in FIG. 8 so as to be piled with the face, on which the electrodes 101 have been formed, facing the piling direction. The clamping jig A is formed in the shape of a "U" having three closed sides and one open side. A groove B is formed in each of the two closed sides in a manner such that the grooves B face one another so as to allow the laser bars 100a to be piled at the bottom portion of the clamping jig A with both longitudinal ends of the laser bars fitted into the grooves. The multiple laser bars 100a are piled up on the bottom face of the clamping jig A.

Thus, the laser bars 100a are mounted on the clamping jig A in a manner such that both sides of the laser bars are exposed, except for both longitudinal ends thereof. The clamping jig A mounting the multiple laser bars 100a are mounted in the chamber of the vapor deposition apparatus, following which vapor deposition is performed.

With the vapor deposition apparatus disclosed in Japanese Unexamined Patent Application Publication No. 2002-164609, the multiple laser bars 100a are mounted on the clamping jig A and their vapor deposition can be performed at the same time. Furthermore, with the aforementioned clamping jig A, the laser bars 100a are mounted with both side faces being exposed, and accordingly, vapor deposition can be performed for both side faces simply by adjusting the direction in which the clamping jig faces the vapor source.

However, the multiple laser bars 100a mounted on the clamping jig A are subjected to vapor deposition process with both end portions thereof fit within the grooves B of the clamping jig A. Accordingly, both ends of the laser bar 100a are not coated with vapor deposited films, i.e., no reflection coating is formed on either ends, creating a problem in which both ends are useless for forming any semiconductor laser product.

Furthermore, the two grooves B are formed with a fixed depth thereof and a fixed length therebetween, creating a problem that the laser bar 100a formed with a length out of a predetermined range cannot be mounted onto the clamping jig A. Accordingly, a particular clamping jig A for vapor deposition needs to be made corresponding to the length of the laser bars 100, which is impractical for general application. Furthermore, a laser bar 100a which has been broken into a short length in the cleaving process cannot be mounted on such a clamping jig A.

If any of the laser bars 100a is broken and falls down from the clamping jig A after being mounted thereon, a gap is created in a pile of the laser bars 100a, which results in a problem that any of the laser bar 100a may incline, causing irregularity in the film thickness of the reflection coating on the side face of each laser bar.

With the clamping jig A, the laser bars 100a are mounted so as to fit the grooves B. Accordingly, in the event that a portion near the end of the laser bar 100 is damaged due to contact with the corner of the groove B, the damaged portion is useless for forming any semiconductor laser product.

The aforementioned clamping jig A is formed in the shape of a "U" having a single open side and three closed sides as shown in FIG. 8, creating a problem in which the clamping jig A is readily deformed due to heat. Deformation of the clamping jig A creates a problem of deformation of the laser bars mounted thereon.

SUMMARY OF THE INVENTION

It is an object of the present invention to provide a clamping jig for mounting semiconductor laser bars so as to form reflection coating on a side face of each laser bar, including both end portions thereof, by performing vapor deposition process for a great number of laser bars at the same time without causing damage or deformation thereto. (Note that a side face of each laser bar corresponds to an end face of laser chips processed from the laser bar.)

A clamping jig according to the present invention can be used for mounting semiconductor laser bars so as to form reflection coating with predetermined reflectivity by vapor disposition or sputtering on a predetermined face of each semiconductor laser bar, which has been formed by cleaving a semiconductor wafer into a number of bars.

A clamping jig according to one embodiment of the present invention comprises: multiple supporting bars for holding the laser bars therebetween; a pair of supporting plates each of which has a mounting face for mounting the supporting bars in a row; a pressing member for pressing the supporting faces of the supporting bars for holding the laser bars; pressing-cover members for covering both end portions of each supporting bar so as to prevent each supporting bar from falling down from the supporting plate; and a supporting frame for detachably supporting the supporting plates and pressing-cover members.

In the clamping jig according to the present invention, each supporting bar includes a pair of front and back longitudinal supporting faces for supporting the laser bars. The supporting bar has a predetermined longitudinal length greater than the laser bar and suitable for mounting to the supporting frame.

The clamping jig is structured such that a pair of supporting plates can be mounted on the supporting frame with their mounting faces facing one another at a predetermined interval, or instead of the pair of supporting plates, one supporting plate and one pressing-cover member can be mounted on the supporting frame. The mounting face of the supporting plate may be designed to be inserted within the supporting frame.

A clamping jig according to one embodiment of the present invention is configured such that the aforementioned pair of supporting plates can be fixed to the rectangular supporting frame with the mounting faces of the supporting plates facing one another, sandwiching the rectangular supporting frame therewith, or being inserted into the opening within the supporting frame.

Furthermore, in the state wherein the aforementioned pair of supporting plates is fixed onto the supporting frame, the mounting plates thereof face one another at a greater interval than the width of the face of each laser bar on which electrodes have been formed. Specifically, the aforementioned pair of supporting plates is fixed to the supporting frame such that each laser bar generally is in contact with both the supporting plates when the laser bars and the supporting bars are disposed between the aforementioned pair of mounting faces. As described above, the pair of supporting plates is fixed onto the supporting frame with such a gap, thereby mounting the laser bars and the supporting bars between the pair of supporting plates.

Alternatively, the clamping jig according to the present invention may have a configuration wherein only one of the aforementioned supporting plates is fixed onto the supporting frame, and the laser bars and the supporting bars are alternately mounted on the mounting face of the supporting plate fixed on the supporting frame, following which the pressing cover members are fixed to the supporting frame so as to cover both ends of each supporting bar.

The supporting bars are mounted to the supporting plate such that the supporting faces for supporting the laser bars face one another.

Furthermore, with the multiple supporting bars, each supporting face is pressed into contact with the face of the corresponding laser bar on which the electrodes have been formed, whereby a pair of supporting bars holds a laser bar.

Note that each laser bar is disposed between the supporting bars at the middle portion along the longitudinal direction of the supporting bar.

Following the laser bars being mounted such that each laser bar is held by the adjacent supporting bars, the supporting faces of the supporting bars are caused to be pressed by the pressing member such as a spring screw or a clamp plate. The clamping jig according to the present invention is structured such that the pressing member presses the supporting bars so as to increase the contact pressure on the face between the adjacent supporting bar and laser bar so that each laser bar is held by the adjacent supporting bars in a secure manner.

Furthermore, according to one aspect of the present invention, the pressing cover members are fixed to the supporting frame mounting the laser bars and the supporting bars on the mounting face thereof so as to cover both ends of each supporting bar, thereby preventing the supporting bars from falling down from the mounting face of the supporting plate.

Furthermore, the pressing cover member may be formed of a bar-shaped plate member or a rod-shaped member so as to cover one end of each of the semiconductor laser bars at the same time.

A clamping jig according to one embodiment of the present invention can be used for vapor deposition process for one side face of each laser bar in a manner wherein a single supporting plate is fixed to the supporting frame, and the supporting bars and the laser bars are mounted on the mounting face of the supporting plate, following which the supporting bars are pressed by the pressing member, and the pressing cover members are fixed to the supporting frame. The clamping jig with the aforementioned configuration is mounted onto the rotary dome of the vapor deposition apparatus so as to perform vapor deposition process of the laser bars.

In the event that the other side face of each laser bar is subjected to vapor deposition process, operations are performed as follows. That is, following the first vapor deposition, the clamping jig is separated from the rotary dome and the pressing cover members are separated from the clamping jig with the pressing cover members facing upward. Subsequently, another supporting plate is fixed to the supporting frame so as to cover the laser bars. Thus, the laser bars and the supporting bars are mounted within a space surrounded by the two supporting plates and the supporting frame.

Subsequently, the supporting frame is turned over such that the supporting plate fixed in this preparation for the second vapor deposition faces downward, and the supporting plate previously fixed for the first vapor deposition is removed from the supporting frame. Subsequently, the pressing cover members are fixed to the supporting frame so as to cover both ends of each supporting bar. Note that when the pressing cover members are fixed to the supporting frame, each laser bar is mounted with the other side face that has not been subjected to vapor deposition being exposed. The clamping jig with the aforementioned configuration is mounted onto the rotary dome so as to perform vapor deposition process for the other side faces of the laser bars.

The clamping jig according to the present invention as described above allows reflection coating to be formed over the side including longitudinal end portions of each laser bar in a secure manner without damage or deformation of the laser bars by performing vapor deposition of a considerable number of laser bars all at once.

Furthermore, preparation for performing vapor deposition to both sides of each laser bar can be done easily by replacing the pressing cover members and a supporting plate onto the supporting frame without separating the laser bars from the supporting frame. This facilitates mounting and removing the laser bars 100a to and from the clamping jig by the user.

Furthermore, with the clamping jig according to the present invention in which each supporting bar is formed with the aforementioned longitudinal length, when both ends of each supporting bar are covered with the pressing cover member, the end portions of each laser bar are not covered, since each laser bar is disposed between the adjacent supporting bars so as to be located at the middle portion along the longitudinal direction of the supporting bar.

Thus, each laser bar is mounted between the supporting bars such that the entirety of its face that is to be coated with a vapor deposition film is exposed, and accordingly reflection coating can be formed over the entire face to be coated with a vapor deposition film. Such face is hereinafter referred to as a "deposition-face".

Furthermore, even multiple laser bars with different lengths can be mounted onto a single clamping jig, thereby enabling vapor deposition of a considerable number of laser bars at the same time. In particular, even in the event that any laser bars have been unintentionally formed with an excessively short length, vapor deposition process can be performed on such laser bars together with other laser bars having a normal length. As described above, vapor deposition process can be performed on multiple laser bars regardless of the length thereof, which is practical for wider range of application by the clamping jig.

Furthermore, the supporting bars for holding the laser bars are each formed in the shape of a bar, and accordingly each supporting bar undergoes minimal deformation due to heat during vapor deposition, which results in less deformation of the laser bars.

Note that vapor deposition must be performed on the side face of each laser bar such that the vapor reaches the edge of the face of the laser bar on which the electrodes have been formed. The face of a laser bar on which the electrodes have been formed is hereinafter referred to as a "electrode-formed face". Otherwise, parts of the edge of the side face of each laser bar may not be coated with the vapor deposition film. Accordingly, in order to form reflection coating with excellent uniformity in a secure manner, vapor deposition must be performed such that the vapor surrounds the edge of the electrode-formed face.

Accordingly, the supporting face of each supporting bar may have a smaller width than the laser bar's width (i.e., the width of the electrode-formed face).

Thus, each supporting bar is formed with the aforementioned width, and accordingly, each laser bar can be mounted such that the side face (i.e., deposition-face) thereof protrudes from the side faces of the adjacent supporting bars. Accordingly, vapor deposition can be done on the side face (deposition-face) of each laser bar such that the vapor reaches the portion (the portion protruding from the adjacent supporting bars) of the electrode-formed face of each laser bar.

According to the present invention, a film of vapor deposition material can be formed with excellent uniformity over the whole of each laser bar's deposition-face by allowing the vapor to reach the edge of the electrode-formed face of each laser bar, as described above. Furthermore, the amount of the vapor which surrounds the edge of each laser bar can be controlled to a desired value simply by adjusting the width of the supporting face of each supporting bar.

Furthermore, according to one embodiment of the present invention, the supporting face of each supporting bar may be formed with a coefficient of friction μa equal to or greater than 0.9 μb and equal to or smaller than 1.1 μb, wherein μb represents the coefficient of friction of the surface of the semiconductor laser bar. That is, the supporting face of each supporting bar is preferably formed with a coefficient of friction μa substantially the same as the coefficient of friction μb of the surface of each semiconductor laser bar.

By designing the supporting face of each supporting bar to have generally the same coefficient of friction as that of the surface of each laser bar, each laser bar can be held by the adjacent supporting bars in a secure manner without falling out from between the adjacent supporting bars. Each supporting bar may be formed of Si so as to exhibit a coefficient of friction in such a range.

Furthermore, the clamping jig according to the present invention includes the pressing member for pressing the supporting bars, and thereby the contact face pressure between the adjacent supporting bar and the laser bar can be increased so that each laser bar is held by the adjacent supporting bars in a secure manner.

Furthermore, even in the event that any part of the supporting bars falls down from the supporting frame, the resultant gap can be immediately filled with the adjacent supporting bar by means of the pressing member so that the other lasers bars can be held by the supporting bars without being slanted. Thus, even in the event that any supporting bar falls down from the clamping jig, reflection coating having precise film thickness can be formed on the deposition-faces of the other laser bars.

Furthermore, according to one embodiment of the present invention, the pressing cover members may be designed to cover only both ends of each supporting bar so that the supporting bars are prevented from falling down from the supporting base, while exposing the entire face of laser bar's deposition-face.

BRIEF DESCRIPTION OF THE DRAWINGS

FIGS. 7A and 7B are explanatory diagrams for describing the process of cleaving a semiconductor wafer into a number of bars, wherein FIG. 7A shows the semiconductor wafer before being cleaved, and FIG. 7B shows the laser bars formed by cleaving the semiconductor wafer.

DESCRIPTION OF THE PREFERRED EMBODIMENTS

Figure 1:
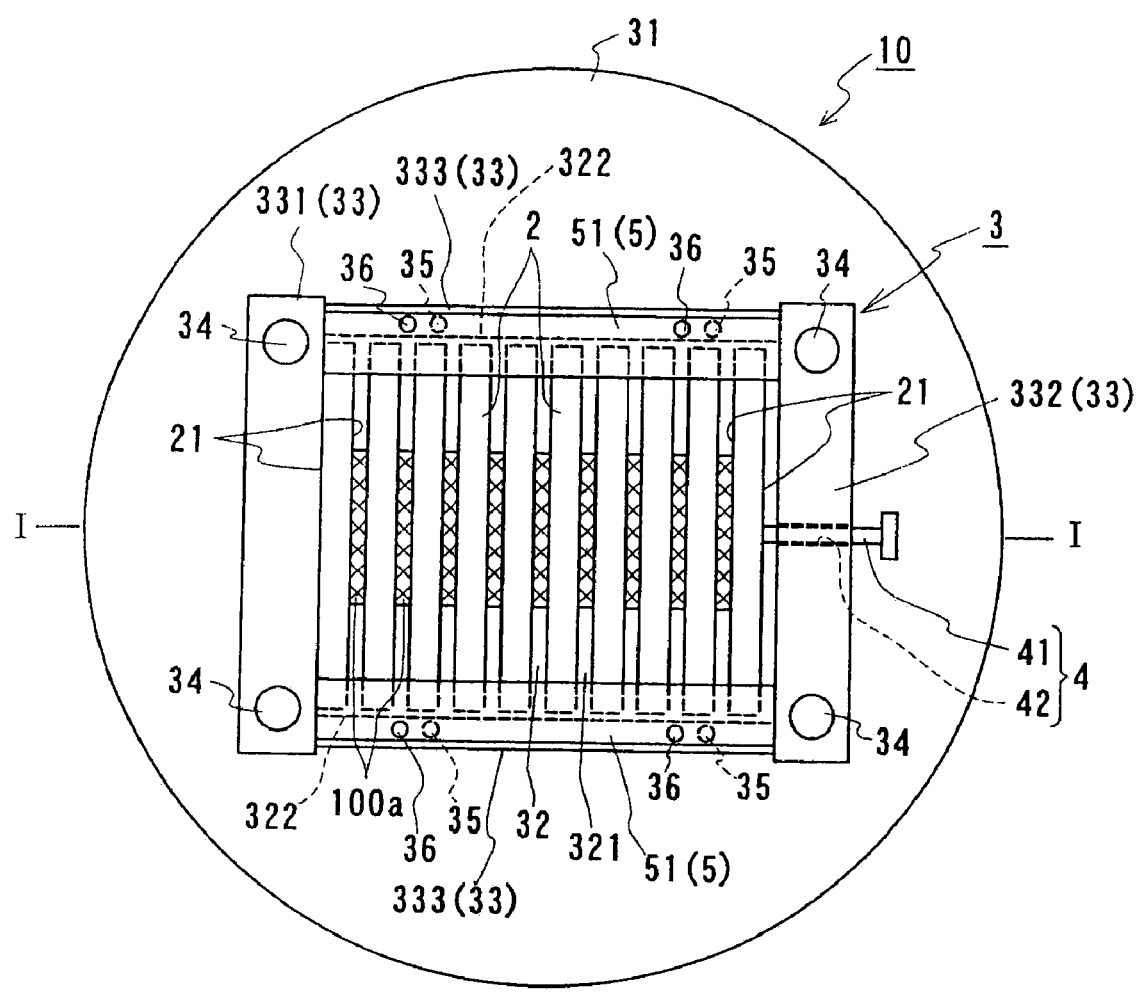
FIG. 1 is a plan view of a clamping jig for semiconductor laser bars according to the present invention, wherein one side of each laser bar is exposed.

A description is made below regarding the embodiments according to the present invention. Note that the same components are denoted by the same reference characters, and redundant descriptions will be omitted. Note that the dimensions are not necessarily to scale in the drawings, regardless of the description in this specification.

Figure 2:
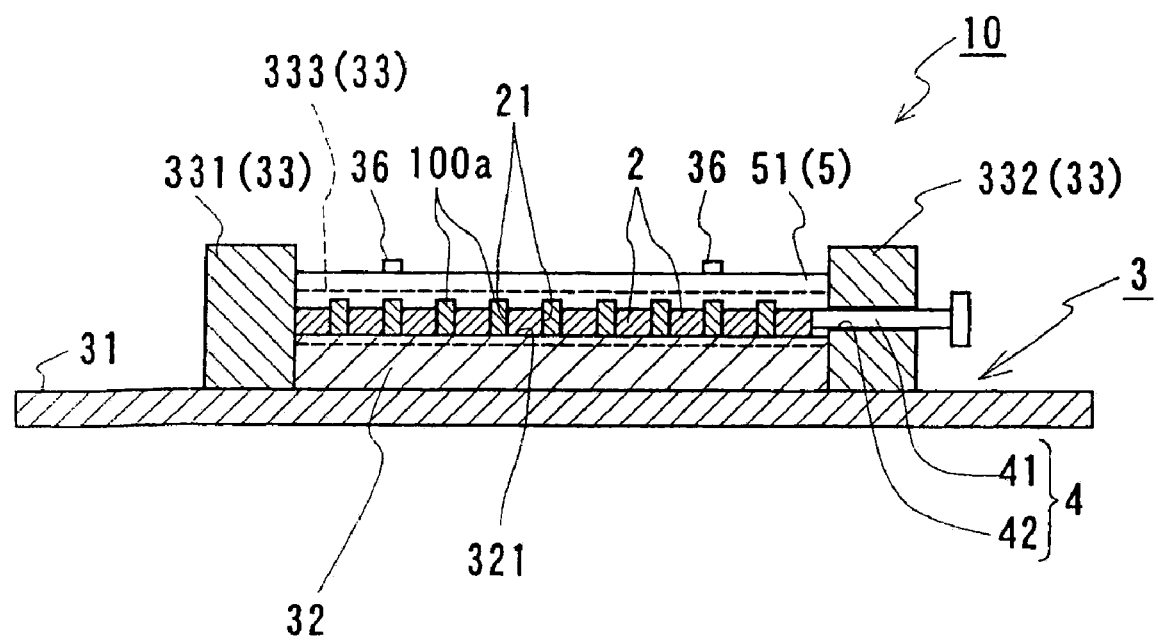
FIG. 2 is a cross-sectional view of the clamping jig taken along line I-I in FIG. 1.
Figure 3:
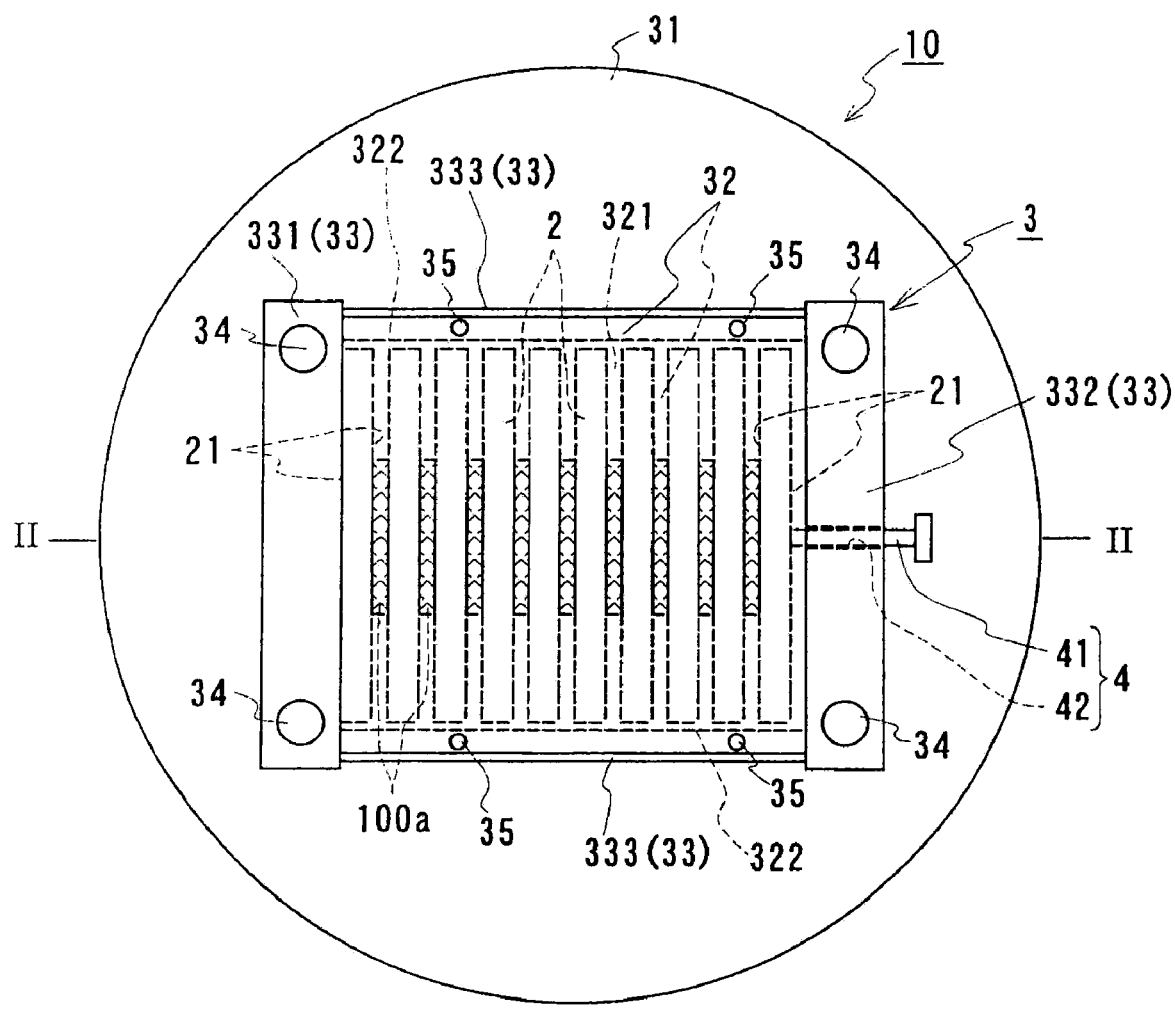
FIG. 3 is a plan view of a clamping jig for semiconductor laser bars according to the present invention, wherein each laser bar is mounted between a pair of supporting plates.
Figure 4:
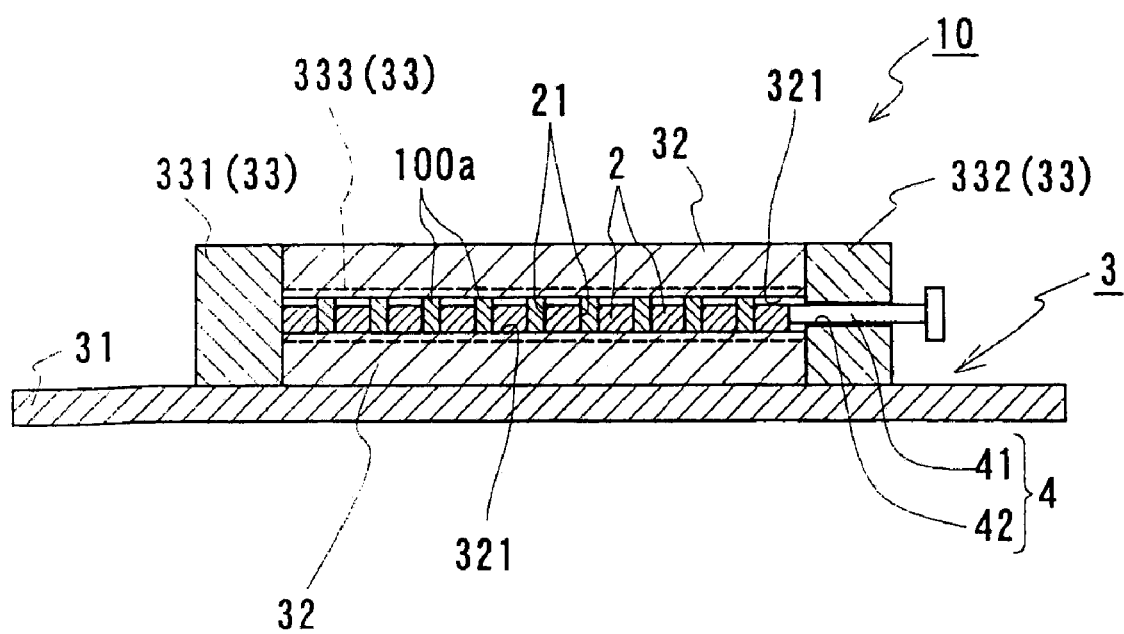
FIG. 4 is a cross-sectional view of the clamping jig taken along line II-II in FIG. 3.
Figure 5:
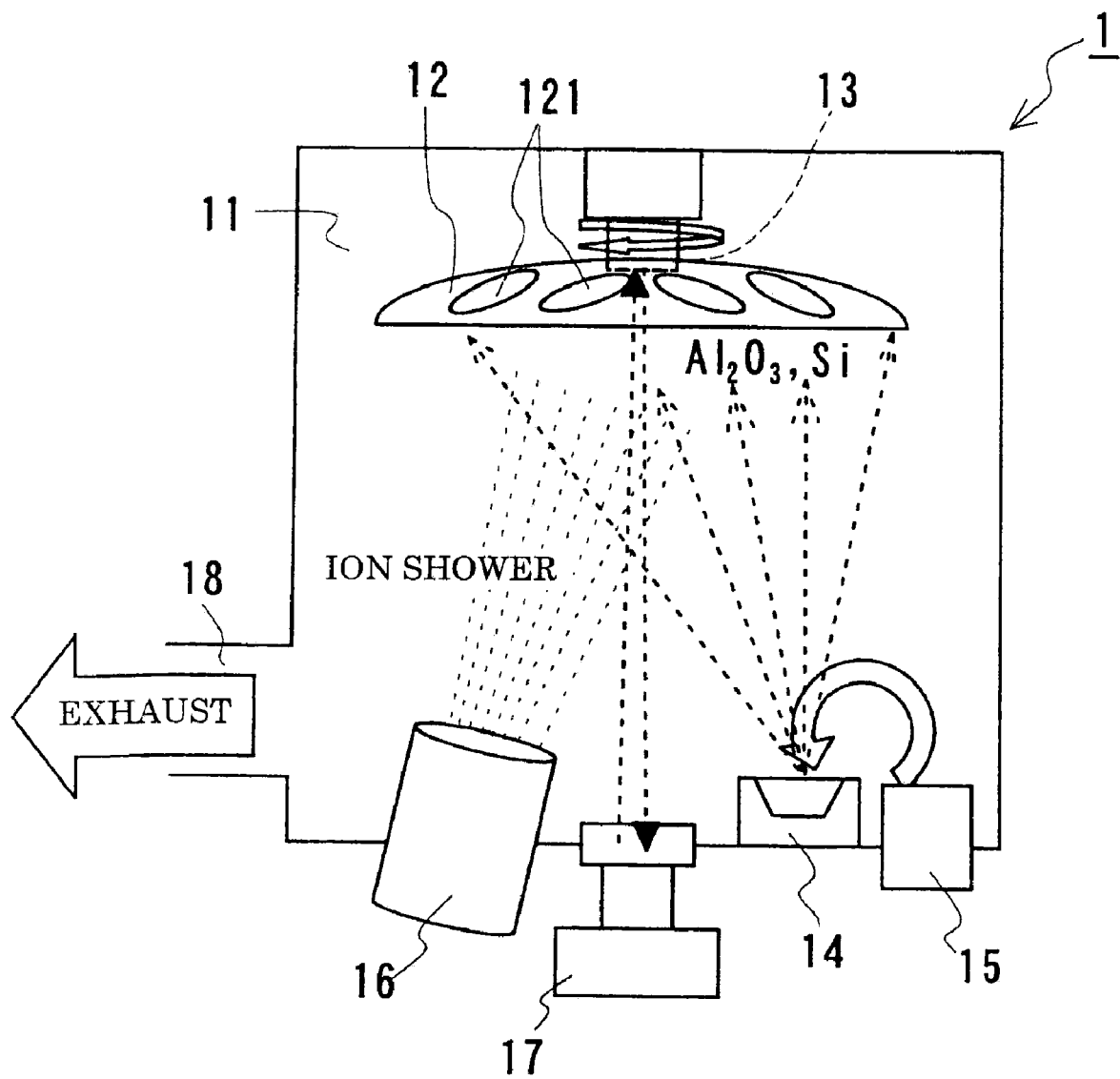
FIG. 5 is an entire configuration diagram which shows vacuum vapor deposition apparatus to which clamping jigs according to the present invention can be mounted.
Figure 6:
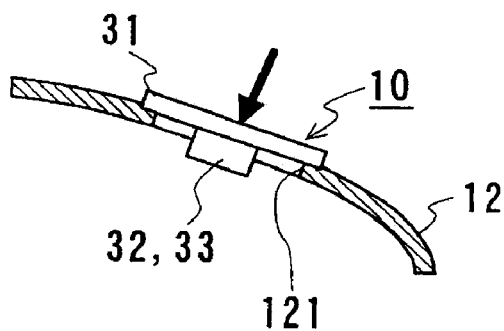
FIG. 6 is a partial cross-sectional view which shows a clamping jig mounted on a rotary dome of the vacuum vapor deposition apparatus.

FIG. 1 is a plan view of a clamping jig for semiconductor laser bars according to the present invention, wherein each laser bar is mounted with one face being exposed. FIG. 2 is a cross-sectional view of the clamping jig taken along line I-I in FIG. 1. FIG. 3 is a plan view of a clamping jig for semiconductor laser bars according to the present invention, wherein each laser bar is mounted between two supporting plates. FIG. 4 is a cross-sectional view of the clamping jig taken along line II-II in FIG. 3. FIG. 5 is an entire configuration diagram which shows vacuum vapor deposition apparatus to which the clamping jig according to the present invention is mounted, and FIG. 6 is a partial cross-sectional view which shows the clamping jig mounted on a rotary dome of the vacuum vapor deposition apparatus.

Figure 7:
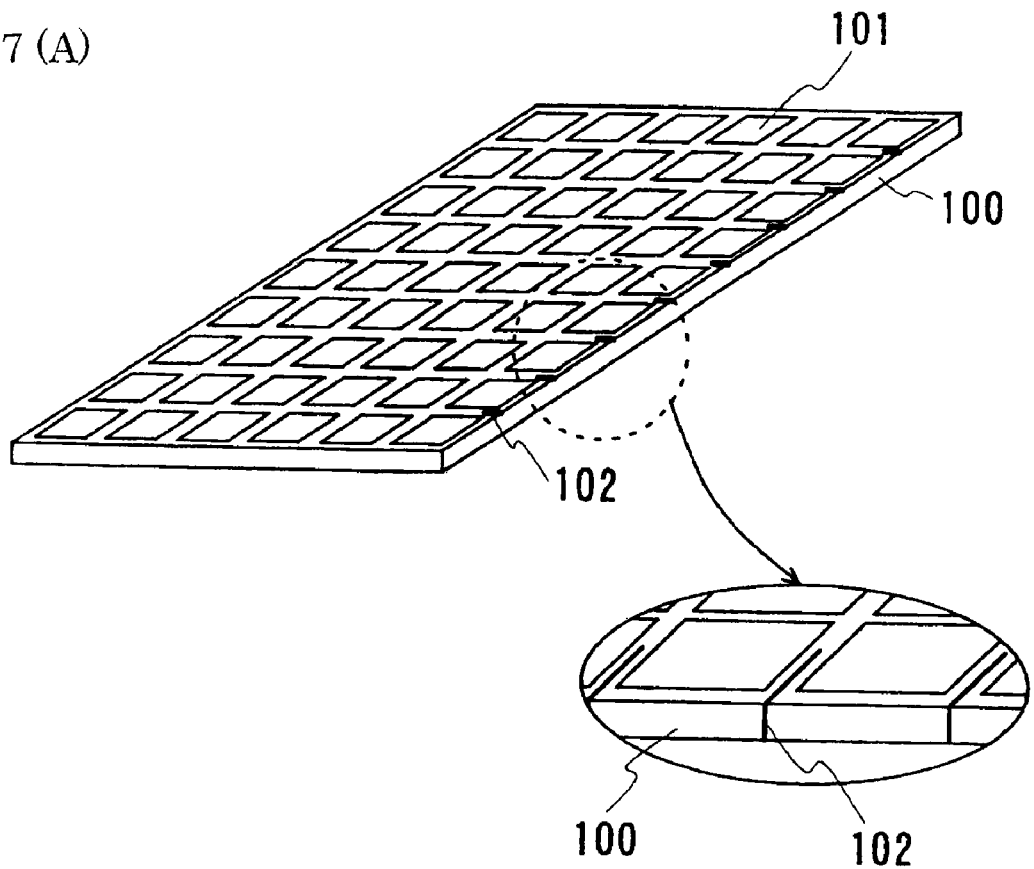
Figure 7:
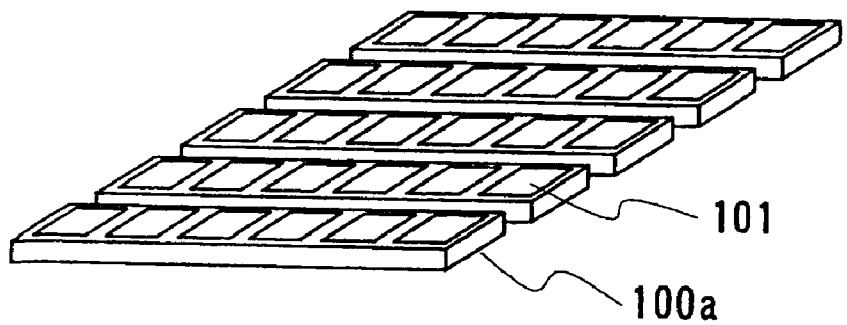
Figure 8:
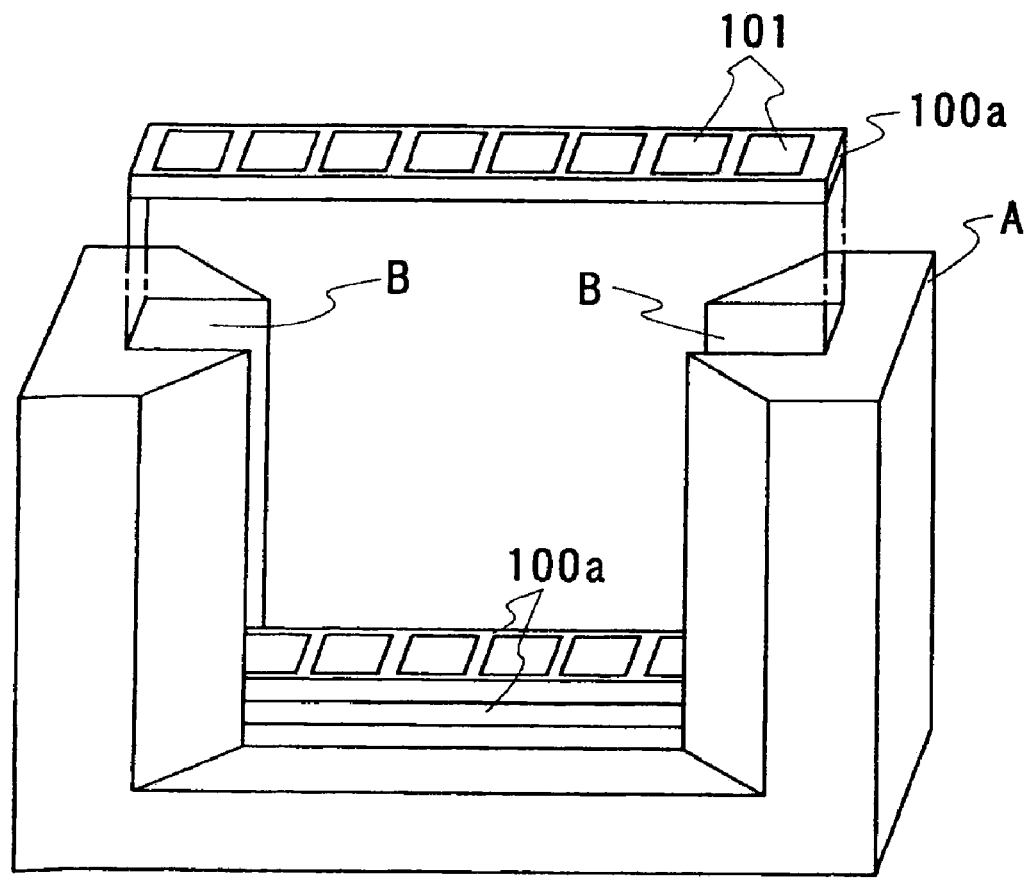
FIG. 8 is a perspective view which shows a conventional clamping jig.

The clamping jig according to the present embodiment is used for mounting the semiconductor laser bars 100a formed by cleaving the semiconductor wafer 100 formed of a material containing GaAs, In, or the like, into a number of bars, as shown in FIGS. 7A and 7B, in order to form reflection coating with predetermined reflectivity on a predetermined face of each semiconductor laser bar 100a by vacuum vapor deposition.

Laser bars 100a are subjected to vapor deposition, being mounted on a rotary dome 12 provided in a chamber of a vacuum vapor deposition apparatus 1 shown in FIG. 5. Accordingly, the laser bars 100a are mounted to a clamping jig 10, following which each clamping jig 10 mounting the laser bars 100a is mounted on the rotary dome 12, whereby mounting of the laser bars 100a onto the rotary dome 12 is completed.

The clamping jig 10 according to the present embodiment shown in FIGS. 1 through 4 includes multiple supporting bars 2 for supporting the laser bars 100a, supporting bases 3 for mounting the supporting bars 2, a pressing member 4 for pressing the supporting bars 2, and pressing cover members 5 for fixing both ends of each supporting bar 2 to the supporting bases 3.

Each supporting bar 2 is formed of Si in the shape of a bar having supporting faces 21 for supporting the laser bars 100a. The supporting faces 21 are formed on a pair of the front and back faces of longitudinal faces of the supporting bars.

The clamping jig 10 includes multiple supporting bars 2, wherein the supporting bars 2 and the laser bars 100a are alternately mounted thereon. At this time, the supporting faces 21 of each supporting bar 2 face the corresponding laser bars 100a, and the electrode-formed face of each laser bar 100a is in contact with the supporting face 21 of the corresponding supporting bar 2 such that each laser bar 100a is held between a pair of the supporting bars 2.

Furthermore, each of the supporting bars 2 are formed with a length greater than that of each laser bar 100a in the longitudinal direction, and within a predetermined length so as to be mounted within a supporting frame 33 as described later, the width of the supporting face 21 being smaller than the width of the electrode-formed face of the laser bar 100a.

For example, each laser bar 100a is formed with a longitudinal length of 6.5 mm, a width (width of electrode-formed face) of 0.35 mm, and a thickness of 0.1 mm. On the other hand, each supporting bar 2 is formed with a longitudinal length of 18 mm, a width of the supporting face of 0.3 mm, and a thickness of 0.7 mm.

Furthermore, the supporting faces 21 (which is in contact with the laser bars 100a) of each supporting bar 2 are designed to have substantially the same coefficient of friction $\mu a$ as the coefficient of friction $\mu b$ of the faces of the laser bar 100a. For example, each of the laser bars 100a is formed with a coefficient of friction $\mu b$ of 0.54. On the other hand, each of the supporting bars 2 is formed with a coefficient of friction $\mu a$ of 0.58.

The clamping jig 10 according to the present embodiment shown in FIGS. 1 through 4 includes ten supporting bars 2 for mounting nine laser bars 100a. Note that while FIGS. 1 through 4 show the clamping jig including a small number of laser bars for simplifying description, the clamping jig according to the present invention may include around 50 supporting bars 2 so as to mount around 50 laser bars.

The supporting base 3 includes a disk-shaped mounting plate 31, a rectangular supporting plate 32 mounted at the middle portion of the mounting plate 31, and a supporting frame 33. The mounting plates 31 are mounted onto the rotary dome 12 of the vacuum deposition apparatus 1.

While one face of the rectangular supporting plate 32 is formed flat, the other face includes a recessed mounting face 321, on which the supporting bars 2 are mounted, between two erected sides 322 extending along the two longitudinal sides of the supporting plate to the end portions thereof. According to the present embodiment, the clamping jig 10 is structured such that a single supporting plate 32 can be used at the time of vapor deposition process, as shown in FIGS. 1 and 2, and a pair of the supporting plates 32 can be used for sandwiching the laser bars therebetween as shown in FIGS. 3 and 4.

The mounting face 321 is inserted within the supporting frame 33 such that the erected sides 322 are pressed into contact with the supporting frame 33. The mounting face 321 is formed with a sufficient area for mounting all the multiple laser bars 100a and multiple holding bars 2 for supporting the laser bars 100a without these bars protruding therefrom.

One side of the supporting frame 33 serves as a contact portion 331 for being pressed into contact with the supporting face 21 of one of the supporting bars 2, and the side facing the contact portion 331 serves as a supporting wall portion 332 for supporting a spring screw 41 of the pressing member 4. On the other hand, the other two sides serve as fixing portions 333 for fixing the erected sides 322 of the supporting plate 32 or the pressing cover members 5.

The contact portion 331 is pressed into contact with the supporting bar 2 mounted at the outermost portion thereof on the mounting face 321. With the present embodiment, first, one of the supporting bars 2 is mounted at the outermost portion on the mounting face 321 so as to be pressed into contact with the contact portion 331, following which the laser bars 100a and the other supporting bars 2 are alternately mounted on the mounting face 321.

The supporting wall portion 332 includes a through screw hole 42 to which is screwed the spring screw 41.

The supporting frame 33 can be detachably fixed to the mounting plate 31 by screws 34 at the contact portion 331 and the supporting wall portion 332.

The fixing portions 333 are structured such that the erected sides 322 of the mounting plate 32 and the pressing cover members 5 can be detachably fixed thereto with screws 35 and screws 36, respectively.

The pressing member 4 comprises the spring screw 41 of which the tip is formed of an elastic member, i.e., a spring, and the screw hole 42 formed on the supporting wall portion 332. The pressing member 4 has a configuration wherein upon the user turning the spring screw 41 screwed to the screw hole 42 from the outside of the supporting wall portion 332, the spring screw 41 is pressed into contact with the supporting face 21 of the adjacent supporting bar 2 for supporting the laser bars 100a.

The two pressing cover members 5, which may be formed of a bar-shaped plate member 51, are detachably fixed onto the two fixing portions 333, respectively. One of the two bar-shaped plate members 51 is fixed to one of the fixing portions 333 with one end of each supporting bar 2 mounted on the mounting face 321 being covered therewith. The other bar-shaped plate member 51 is fixed to the other fixing portion 333 with the other end of each supporting bar 2 mounted on the mounting face 321 being covered therewith in the same manner. As described above, with the present embodiment, both ends of each supporting bar 2 are covered with a pair of the bar-shaped plate members 51 so as not to fall down from the mounting face 321.

In the present embodiment, one of the two supporting plate 32 is fixed to the fixing portions 333 of the supporting frame 33, and the supporting frame 33 to which the supporting plate 32 has been fixed is fixed to the mounting plate 31 such that the supporting plate 32 is introduced between the fixing portions 333 and the mounting plate 31.

In the case of applying vapor deposition onto the face of one side of the laser bars 100a, the spring screw 41 forming the pressing member 4 is loosened in the screw hole 42, following which the multiple supporting bars 2 and the laser bars 100a are alternately mounted on the mounting face 321 of the supporting base 3 with the supporting face of each supporting bar 2 being in contact with the electrode-formed face of the corresponding laser bar 100a, or the back face thereof, i.e., each laser bar 100a is mounted so as to be introduced between the supporting bars 2.

At this time, the laser bars 100a are each mounted at the middle portion along the longitudinal direction of the supporting bar 2 such that even in the state that the bar-shaped plate members 51 are fixed to the fixing portions 333, the ends of each laser bar 100a are not covered with the bar-shaped plate members 51. Note that in the state that the supporting bars 2 and the laser bars 100a are mounted on the mounting face 321, the deposition-face of each laser bar 100a protrudes from the top faces of the supporting bars 2 as shown in FIG. 2.

Following mounting of the supporting bars 2 and the laser bars 100a onto the mounting face 321, the tip of the spring screw 41 is pressed into contact with the supporting face 21 of the supporting bar 2 by turning the spring screw 41 screwed to the screw hole 42 in the tightening direction. Thus, the supporting bar 2 is pressed toward the pressing portion 331 by the spring screw 41, and thus, each laser bar 100a is held by the adjacent supporting bars 2 due to increased contact pressure on the face between the supporting bar 2 and the laser bar 100a.

Subsequently, one of the bar-shaped plate members 51 is fixed to one of the fixing portions 333 with one end of each supporting bar 2 mounted on the mounting face 321 being covered therewith. The other bar-shaped plate member 51 is fixed to the other fixing portions 333 with the other end of each supporting bar 2 mounted on the mounting face 321 being covered therewith, as well. Thus, both ends of each supporting bar 2 are covered with a pair of the bar-shaped plate members 51 so as to prevent the supporting bars 2 from falling down from the mounting face 321, whereby mounting of the laser bars 100a onto the clamping jig 10 is completed. Subsequently, the clamping jig 10 mounting the laser bars 100a is mounted onto the rotary dome 12 in the vacuum vapor deposition apparatus 1.

The vacuum vapor deposition apparatus 1 includes the rotary dome 12 and a monitor substrate 13 on the upper portion in the chamber 11, and further includes a crucible 14, an ion beam gun (EB gun) 15, an ion gun 16, and an optical film-thickness monitor 17, as shown in FIG. 5.

The chamber 11 has a configuration for maintaining a predetermined degree of vacuum by evacuating through an exhaust vent 18. The rotary dome 12 is rotatably mounted onto the ceiling of the chamber 11, and has multiple mounting openings 121 for mounting the multiple clamping jigs 10. The clamping jig 10 is mounted to the mounting opening 121 such that the supporting frame 33 and the supporting plate 32 are inserted into the mounting openings 121 from the ceiling side of the rotary dome 12 as shown in FIG. 6.

The rotary dome 12 includes the aforementioned monitor substrate 13 at the middle portion on the lower face thereof. At the time of vapor deposition, the optical film-thickness monitor 17 casts light onto the monitor substrate 13 so as to be reflected therefrom. The optical film-thickness monitor 17 receives the light reflected from the monitor substrate 13 in order to measure the change in the light intensity between the incident light and the reflected light.

A description is made below regarding vapor deposition process for the laser bars 100a. First, the clamping jig 10 is mounted onto the rotary dome 12 such that the deposition-face of each laser bar 100a faces the vapor source. On the other hand, a vapor deposition material, e.g., $Al_2O_3$, Si, is loaded into the crucible 14. Subsequently, the chamber 11 is evacuated through the exhaust vent 18, and is maintained at a predetermined degree of vacuum.

Subsequently, the light is cast from the optical film-thickness monitor 17 onto the monitor substrate 13. The light reflected from the monitor substrate 13 is received by the optical film-thickness monitor 17 so as to measure the change in the light intensity.

Following the above-described preparation, the output of the EB gun 15 is gradually increased while rotating the rotary dome 12 so as to cast an ion beam from the EB gun 15 onto the vapor source within the crucible 14 in order to evaporate the vapor source toward the rotary dome 12, whereby reflection coating is formed on the laser bars 100a. Note that the rotary dome 12 is rotated in order to form reflection coating with high uniformity.

Furthermore, an ion beam is cast from the ion gun 16 at the same time as the EB gun 15. The ion beam is cast from the ion gun 16 in order to assist adhesion of the vapor deposition film onto the end faces of the laser bars due to evaporation of the vapor source toward the rotary dome 12, as well as preventing the vapor deposition film formed on the end faces of the laser bars from separating therefrom.

Subsequently, upon the change in the light intensity measured by the optical film-thickness monitor 17 reaching a predetermined value, the output of the EB gun 15 is stopped as well as stopping rotation of the rotary dome 12. Following cooling of the inside of the chamber 11, the vacuum inside the chamber 11 is released, and the clamping jig 10 is retrieved from the chamber 11, whereby vapor deposition process for the laser bars 100a is completed.

Subsequently, the clamping jig 10 is retrieved from the rotary dome 12, following which the second vapor deposition for the other side faces of the laser bars is performed as follows. In the preparation for the second vapor deposition, first, the pair of the bar-shaped plate members 51 is removed from the fixing portions 333 of the supporting frame 33 of the clamping jig 10 retrieved from the rotary dome 12, following which another new supporting plate 32 is fixed onto the fixing portions 333 instead of the bar-shaped members 51. Mounting of the supporting frame 32 onto the fixing portions 333 leads to the state wherein the laser bars 100a and the supporting bars 2 are stored between the two supporting plates 32.

Subsequently, the supporting frame 33 with the two supporting plates 32 mounted thereon is temporarily separated from the mounting plate 31, and is turned over, following which the supporting frame 33 is fixed onto the mounting plate 31 again such that the supporting plate 32 which has been fixed during this preparation faces the mounting plate 31.

Subsequently, the other supporting plate 32, i.e., the supporting plate 32 which has been fixed for the first vapor deposition, is removed from the supporting frame 33, and instead of the removed supporting plate 32, the aforementioned pair of bar-shaped plate members 51 is fixed to the fixing portions 333 of the supporting frame 33 such that both ends of each supporting bar 2 are covered therewith. Note that in this state in which the bar-shaped plate members 51 are fixed onto the supporting frame 33, the other side face (which has not been coated with any vapor deposition film) of each laser bar 100a is exposed.

Subsequently, the clamping jig 10 mounting the laser bars 100a is mounted onto the rotary dome 12 with the other end face of each laser bar 100a which has not been coated with any vapor deposition film being exposed, following which vapor deposition process is performed with the vapor deposition apparatus in the same manner as described above.

Thus, with the present embodiment, each of the laser bars 100a are mounted so as to be held by the supporting bars 2 such that no part of the side face (deposition-face) of each laser bar 100a is covered with a member of any sort, thereby allowing reflection coating to be formed over the entire face of the side face of each laser bar 100a.

Furthermore, with the present embodiment, preparation for vapor deposition to the respective deposition-faces of each laser bar 100 can be made simply by replacing the pressing cover members 5 and supporting plate 32 without removing the laser bars 100 from the supporting frame 33. This facilitates mounting and retrieving of the laser bars 100a by the user.

Furthermore, with the present embodiment, even in the event that the multiple laser bars 100a have been formed with different lengths, the multiple laser bars 100a can be mounted on a single clamping jig 10 so as to perform vapor deposition at the same time. In particular, even in the event that any laser bars 100a have been broken into excessively short lengths in cleaving process, for example, such short-length laser bars 100a can be subjected to vapor deposition process along with other laser bars 100a having a normal length. As described above, with the present embodiment, the multiple laser bars 100a can be subjected to vapor deposition process simultaneously regardless of the length thereof, which enables increased application as a clamping jig.

In particular, the supporting face 21 of each supporting bar 2 is formed with generally the same coefficient of friction as the laser bars 100a, and thus, the supporting bars 2 suitably hold the laser bars 100a therebetween.

Furthermore, with the present embodiment, the supporting bars 2 for holding the laser bars 100a are each formed in the shape of a bar, accordingly each supporting bar 2 is minimally deformed (distorted) due to heat during vapor deposition, thereby lessening deformation of the laser bars 100a.

Furthermore, reflection coating can be formed over the entire face of the side face (deposition-face) of each laser bar 100a with excellent uniformity since each laser bar 100a is subjected to vapor deposition process in a state in which the vapor is allowed to surround a part of the electrode-formed face, i.e., an exposed part protruding from the adjacent supporting bars 2.

Furthermore, with the present embodiment, the spring screw 41 of the pressing member 4 presses the supporting bars 2, thereby increasing the contact pressure on the face between the supporting bar 2 and the laser bar 100a, and thus, each laser bar 100a is held by the adjacent supporting bars 2 in a secure manner.

Furthermore, with the present embodiment, the pressing member 4 presses the supporting bars 2, and accordingly, even in the event that any supporting bar 2 falls down from the supporting base 3, the resultant gap is immediately filled with the adjacent supporting bar 2. Thus, even in the event that any supporting bar 2 falls down from the supporting base 3, the other laser bars 100a can be held by the supporting bars 2 without slanting, thereby allowing reflection coating to be formed on the side face of each laser bar 100a with a precise film thickness.

Furthermore, with the present embodiment, the pressing cover members 5 cover both ends of each supporting bar 2 so as to prevent the supporting bar 2 from falling down from the supporting base 3, and thus, it is possible to prevent each supporting bar 2 from falling down from the supporting base 3, while the entire deposition-face of each laser bar 100a is exposed.

Note that while the description has been made regarding the arrangement wherein the reflection coating is formed on each laser bar by vapor deposition, the clamping jig according to the present invention can be employed in an arrangement wherein the reflection coating is formed by sputtering.

With the clamping jig according to the present invention, each laser bar is mounted between the supporting bars so as to be held by the adjacent supporting bars without any part of the deposition-face of each laser bar being covered by any member, thereby allowing reflection coating to be formed over the entire deposition-face of each laser bar in a secure manner.

Furthermore, preparation for vapor deposition or sputtering process for both deposition faces of each laser bar can be made simply by replacing pressing cover members and a supporting plate onto the supporting frame without removing the laser bars from the supporting frame. This facilitates mounting and retrieving of the laser bars to and from the clamping jig by the user.

What is claimed is:

1. A vapor deposition method for semiconductor laser bars, the method comprising:
preparing a clamping jig for mounting semiconductor laser bars, the clamping jig comprising:
a plurality of supporting bars each of which has a pair of laser-bar supporting faces respectively provided on both the front and back sides thereof and extending in a longitudinal direction;
a supporting frame including a contact portion defined by a side of the supporting frame in contact with one of the supporting faces of an adjacent one of the supporting bars, a supporting wall portion defined by a side of the supporting frame facing the contact portion, and a fixing portion defined by sides of the supporting frame and having faces opposing each other;
a first support plate directly fixed to the face of the fixing portion and having a mounting face on which the supporting bars are mounted so as not to protrude from the mounting face;
a second support plate having the same structure as that of the first support plate and directly fixed to the opposite-side face of the fixing portion;
a pressing cover member including two bar-shaped plate members that are directly fixed to the either face of the fixing portion so that the laser bars mounted on the mounting face of the first support plate are covered at both ends by the pressing cover member; and a pressing member in the supporting wall portion and having a spring screw supported by the supporting wall portion, the pressing member pressing the laser-bar supporting faces of the supporting bars by the spring screw, a first step in which the first support plate is directly fixed to a face of the fixing portion of the supporting frame, the supporting bars and the laser bars are directly mounted and alternately arranged on the mounting face of the first support plate so that each of respective pairs of the supporting bars clamp a laser bar therebetween, the laser-bar supporting faces of the supporting bars are pressed by the pressing member, the pressing cover member is fixed to the opposite-side face of the fixing portion, and one-side end faces of the laser bars protrude beyond the supporting bars and are exposed for vapor deposition processing;

a second step in which the first support plate is directly fixed to a face of the fixing portion, the second support plate is directly fixed to the opposite-side face of the fixing portion, and the laser bars and the supporting bars are in a space surrounded by the first and second support plates and the supporting frame, and the top and bottom are reversed; and a third step in which the pressing cover member is directly fixed to the face of the fixing portion to which the first support plate was fixed in the first step, the second support plate is directly fixed to the opposite-side face of the fixing portion, and the other-side end faces of the laser bars protrude beyond the supporting bars and are exposed for vapor deposition processing.

2. A vapor deposition method for semiconductor laser bars according to claim 1, wherein the mounting face of each support plate can be inserted within said supporting frame of the clamping jig.

3. A vapor deposition method for semiconductor laser bars according to claim 1, wherein said pressing cover member is formed of a bar-shaped plate member or a rod-shaped member so as to cover one end of each of said semiconductor laser bars at the same time.

4. A vapor deposition method for semiconductor laser bars according to claim 1, wherein the supporting faces of said supporting bars have a smaller width than the width of the electrode-formed face of the laser bar.

5. A vapor deposition method for semiconductor laser bars according to claim 1, wherein the supporting faces of said supporting bars are is formed with a coefficient of friction $\mu a$ equal to or greater than 0.9 $\mu b$ and equal to or smaller than 1.1 $\mu b$, wherein $\mu b$ represents the coefficient of friction of the surface of said semiconductor laser bars.

6. A vapor deposition method for semiconductor laser bars according to claim 1, wherein said supporting bars are formed of Si.

* * * * *

UNITED STATES PATENT AND TRADEMARK OFFICE
CERTIFICATE OF CORRECTION

PATENT NO.        : 7,595,089 B2
APPLICATION NO.  : 11/940415
DATED            : September 29, 2009
INVENTOR(S)      : Nobuyuki Mitsui and Hiroshi Inada It is certified that error appears in the above-identified patent and that said Letters Patent is hereby corrected as shown below:

Col. 14, claim 5, line 3, change "bars are is formed" to --bars are formed--.

Signed and Sealed this

Twenty-fourth Day of November, 2009

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 7,595,089 B2 | |
| APPLICATION NO. | : 11/940415 | |
| DATED | : September 29, 2009 | |
| INVENTOR(S) | : Nobuyuki Mitsui and Hiroshi Inada | |

It is certified that error appears in the above-identified patent and that said Letters Patent is hereby corrected as shown below:

Col. 14, claim 5, line 21, change "bars are is formed" to --bars are formed--.

This certificate supersedes the Certificate of Correction issued November 24, 2009.

Signed and Sealed this

Fifteenth Day of December, 2009

David J. Kappos
*Director of the United States Patent and Trademark Office*